(12) United States Patent  
Hu et al.

(10) Patent No.: US 9,214,598 B2  
(45) Date of Patent: Dec. 15, 2015

(54) PIXEL STRUCTURE OF A LIQUID CRYSTAL DISPLAY PANEL AND PIXEL FORMING METHOD THEREOF

(71) Applicant: HannStar Display Corp., New Taipei (TW)

(72) Inventors: Hsien-Tang Hu, Taichung (TW); Ko-Ruey Jen, Taipei (TW); Jui-Chi Lai, Kaohsiung (TW)

(73) Assignee: HANNSTAR DISPLAY CORPORATION, Wugu Dist., New Taipei (TW)

( * ) Notice: Subject to any disclaimer, the term of this patent is extended or adjusted under 35 U.S.C. 154(b) by 61 days.

(21) Appl. No.: 14/058,290

(22) Filed: Oct. 21, 2013

(65) Prior Publication Data

US 2014/0168583 A1    Jun. 19, 2014

(30) Foreign Application Priority Data

Dec. 14, 2012    (CN) .......................... 2012 1 0545021

(51) Int. Cl.
*G02F 1/1339* (2006.01)  
*H01L 33/02* (2010.01)  
*G02F 1/1335* (2006.01)

(52) U.S. Cl.  
CPC ............ *H01L 33/02* (2013.01); *G02F 1/13394* (2013.01); *G02F 1/133512* (2013.01)

(58) Field of Classification Search  
CPC ............ G02F 1/13394; G02F 1/13392; G02F 1/133512; G02F 2001/13396; G02F 1/1339; G02F 1/134363; G02F 1/1341  
USPC .................................................. 349/155, 157  
See application file for complete search history.

(56) References Cited

U.S. PATENT DOCUMENTS

| | | | |
|---|---|---|---|
| 7,133,108 B2 * | 11/2006 | Shimizu et al. ................ | 349/155 |
| 8,471,996 B2 * | 6/2013 | Tsubata ......................... | 349/155 |
| 2004/0114087 A1 * | 6/2004 | Cho et al. ...................... | 349/155 |
| 2007/0177092 A1 * | 8/2007 | Hosoya .......................... | 349/149 |
| 2008/0044761 A1 * | 2/2008 | Son et al. .................... | 430/270.1 |
| 2009/0015780 A1 * | 1/2009 | Choi et al. .................... | 349/156 |

* cited by examiner

*Primary Examiner* — Mike Qi  
(74) *Attorney, Agent, or Firm* — Winston Hsu; Scott Margo

(57) ABSTRACT

A pixel structure of a liquid crystal display panel includes a first substrate; a color filter layer formed on the first substrate, the color filter layer comprising a plurality of filtering areas for filtering light, and a plurality of blocking areas for blocking light; a main spacer formed on one of the blocking areas; a sub spacer formed on another one of the blocking areas; a second substrate; a thin film transistor formed on the second substrate; an insulating layer formed above the thin film transistor and the second substrate; a liquid crystal layer formed between the first substrate and the second substrate; wherein a distance from an upper surface of the insulating layer near the main spacer to the second substrate is greater than a distance from an upper surface of the insulating layer near the sub spacer to the second substrate.

13 Claims, 4 Drawing Sheets

PIXEL STRUCTURE OF A LIQUID CRYSTAL DISPLAY PANEL AND PIXEL FORMING METHOD THEREOF

BACKGROUND OF THE INVENTION

1. Field of the Invention

The present invention relates to a pixel structure of a liquid crystal display panel and a pixel forming method, and more particularly, to a pixel structure of a liquid crystal display panel and a pixel forming method capable of simplifying manufacturing processes of a liquid crystal display panel with a high aperture ratio.

2. Description of the Prior Art

Please refer to FIG. 1. FIG. 1 is a diagram showing a pixel structure of a liquid crystal display panel of the prior art. As shown in FIG. 1, the pixel structure 100 of the liquid crystal display panel comprises a first substrate 110 and a second substrate 120. A color filter layer 112 is formed on the first substrate 110. The color filter layer 112 comprises a plurality of filtering areas 114 (such as red filtering areas, green filtering areas and blue filtering areas) for filtering light, and a plurality of blocking areas 116 for blocking light. A main spacer PS1 and a sub spacer PS2 are respectively formed on the blocking areas 116. A thin film transistor TFT is formed on the second substrate 120, and an insulating layer 122 is formed to cover the thin film transistor TFT and the second substrate 120. An upper surface of the insulating layer is flat, and the insulating layer 122 has a through hole 124 formed beside the thin film transistor TFT. A transparent conductive layer 126 is formed on the insulating layer 122. Since the main spacer PS1 and the sub spacer PS2 can form a gap between the first substrate 110 and the second substrate 120, a liquid crystal material can be filled between the first substrate 110 and the second substrate 120 for forming a liquid crystal layer 130.

According to the above arrangement, the thin film transistor TFT can apply voltage to the liquid crystal layer 130 for driving liquid crystals to tilt in order to display images.

In a one drop fill (ODF) process, in order to increase a aperture ratio of the liquid crystal display panel, the sub spacer PS2 and the transparent conductive layer 126 below must be separated by a gap, thus a length of the sub spacer PS2 is shorter than a length of the main spacer PS1. In order to make the length of the sub spacer PS2 different from the length of the main spacer PS1, when respectively forming the main spacer PS1 and the sub spacer PS2 on the blocking areas 116, a halftone mask process is performed to make the sub spacer PS2 shorter than the main spacer PS1.

However, when the above pixel structure is applied to different liquid crystal display panels, a color filter substrate consisted of the first substrate 110 and the color filter layer 112 requires different halftone masks to form the main and sub spacers with different lengths. Therefore, product development complexity of the liquid crystal display panel with high aperture ratio (HAR) is increased.

SUMMARY OF THE INVENTION

The present invention provides a pixel structure of a liquid crystal display panel, comprising a first substrate; a color filter layer formed on the first substrate, the color filter layer comprising a plurality of filtering areas for filtering light, and a plurality of blocking areas for blocking light; a main spacer formed on one of the plurality of blocking areas; a sub spacer formed on another one of the plurality of blocking areas; a second substrate; a thin film transistor formed on the second substrate; an insulating layer formed above the thin film transistor and the second substrate; a liquid crystal layer formed between the first substrate and the second substrate; wherein a distance from an upper surface of the insulating layer near the main spacer to the second substrate is greater than a distance from an upper surface of the insulating layer near the sub spacer to the second substrate.

The present invention further provides a method for forming a pixel of a liquid crystal display panel, comprising forming a color filter layer on a first substrate, the color filter layer comprising a plurality of filtering areas for filtering light, and a plurality of blocking areas for blocking light; forming a main spacer and a sub spacer on the plurality of blocking areas; forming a thin film transistor on a second substrate; forming an insulating layer above the thin film transistor and the second substrate, wherein a distance from an upper surface of the insulating layer near the main spacer to the second substrate is greater than a distance from an upper surface of the insulating layer near the sub spacer to the second substrate, and the insulating layer has a through hole formed beside the thin film transistor, a distance from a bottom of the through hole to the second substrate is smaller than the distance from the upper surface of the insulating layer near the sub spacer to the second substrate; and forming a liquid crystal layer between the first substrate and the second substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
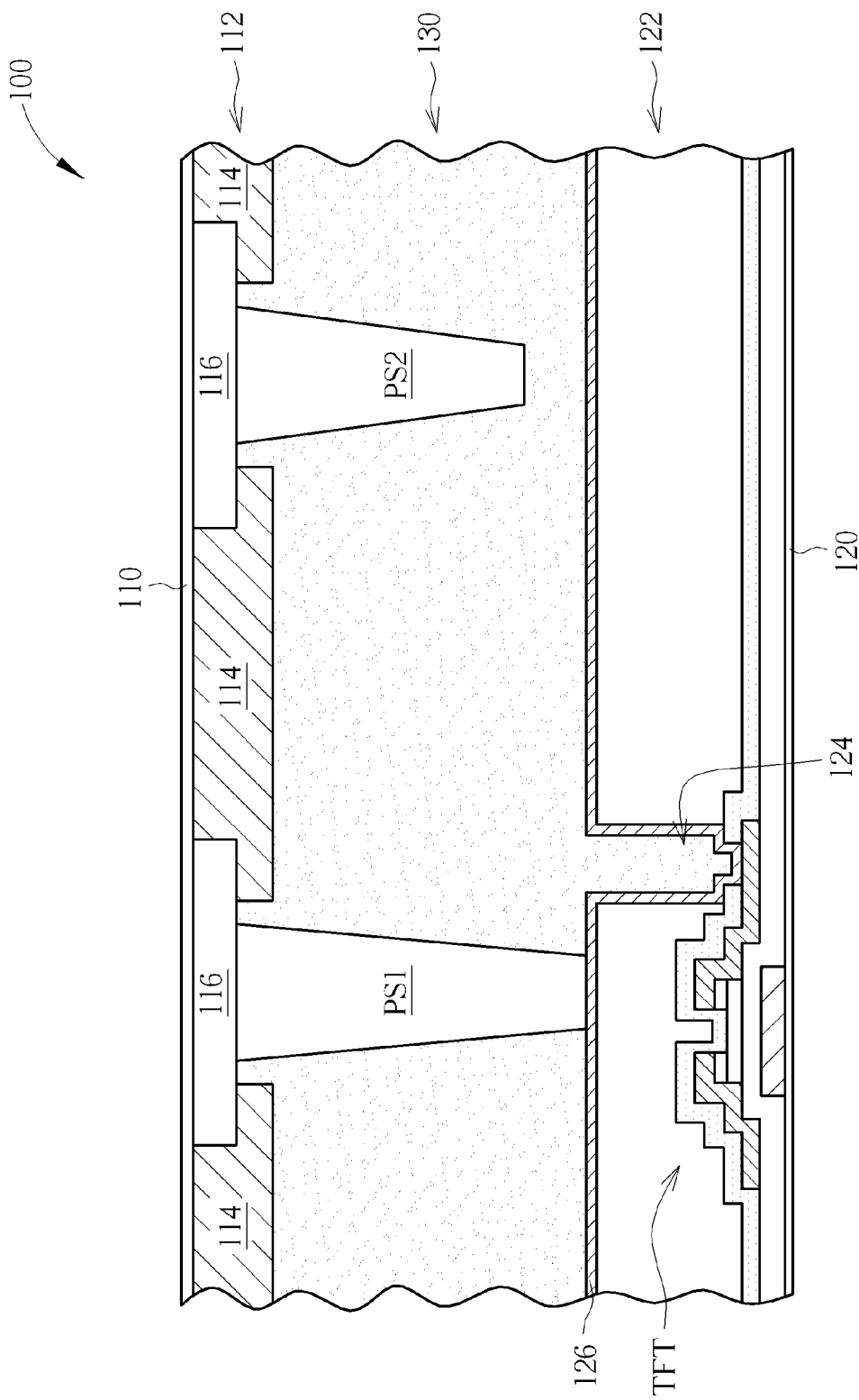
FIG. 1 is a diagram showing a pixel structure of a liquid crystal display panel of the prior art.
Figure 2:
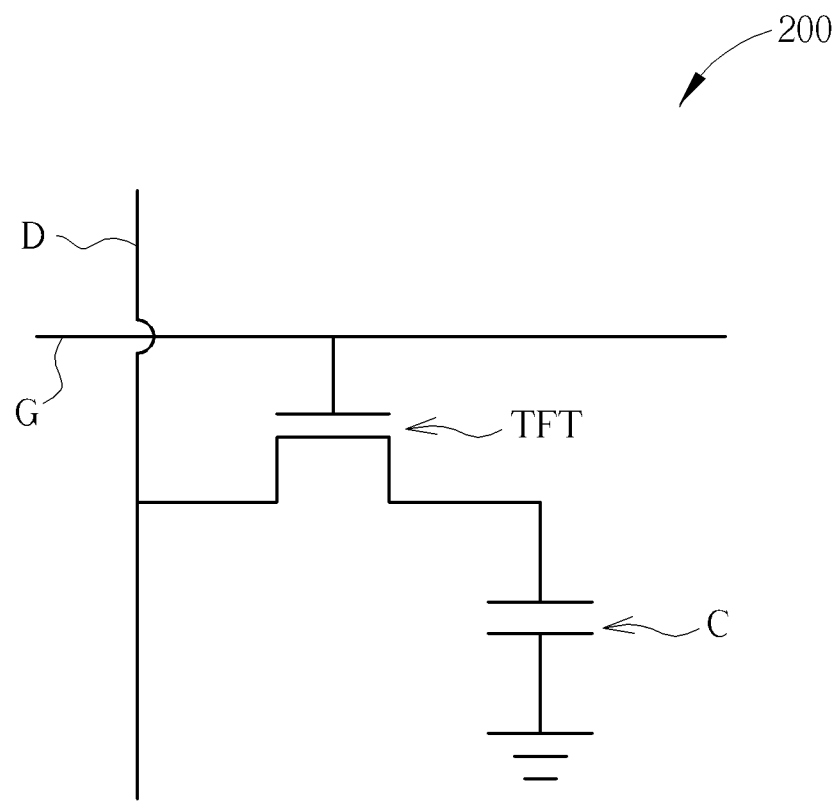
FIG. 2 is a diagram showing a pixel of a liquid crystal display panel.
Figure 3:
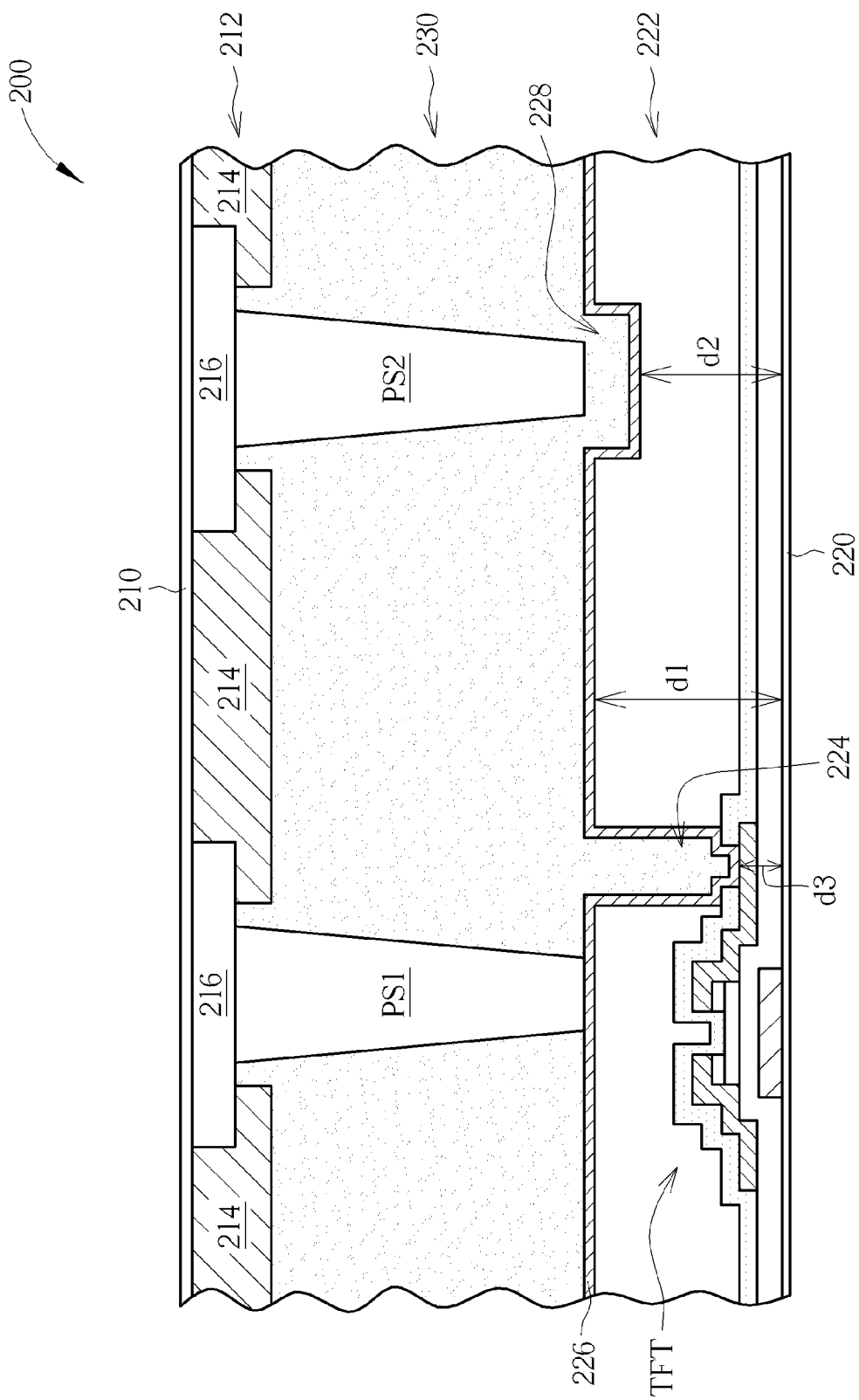
FIG. 3 is a diagram showing a pixel structure of the liquid crystal display panel of the present invention.

Please refer to FIG. 2 and FIG. 3. FIG. 2 is a diagram showing a pixel of a liquid crystal display panel. FIG. 3 is a diagram showing a pixel structure of the liquid crystal display panel of the present invention. As shown in FIG. 2, the pixel 200 of the liquid crystal display panel comprises a thin film transistor TFT and a capacitor C. A first end of the thin film transistor TFT is electrically connected to a data line D, a second end of the thin film transistor TFT is electrically connected to the capacitor C, and a control end of the thin film transistor TFT is electrically connected to a scan line G. When the thin film transistor TFT is turned on by a scan signal on the scan line G, a display voltage on the data line D is written into the capacitor C via the thin film transistor TFT, for further driving liquid crystals of the pixel 200 to tilt in order to display images.

As shown in FIG. 3, the pixel structure 200 of the liquid crystal display panel of the present invention comprises a first substrate 210 and a second substrate 220. A color filter layer 212 is formed on the first substrate 210. The color filter layer 212 comprises a plurality of filtering areas 214 (such as red filtering areas, green filtering areas and blue filtering areas) for filtering light, and a plurality of blocking areas 216 for blocking light. A main spacer PS1 and a sub spacer PS2 are respectively formed on the blocking areas 216. A thin film transistor TFT is formed on the second substrate 220, and arranged below the main spacer PS1. An insulating layer 222 is formed above the thin film transistor TFT and the second substrate 220 for covering the thin film transistor TFT and the second substrate 220. The insulating layer 222 has a through hole 224 formed beside the thin film transistor TFT. A transparent conductive layer 126 is formed on the insulating layer 222. Most area of the insulating layer 222 is flat. Since the main spacer PS1 and the sub spacer PS2 can form a gap between the first substrate 210 and the second substrate 220, a liquid crystal material can be filled between the first substrate 210 and the second substrate 220 for forming a liquid crystal layer 230. The thin film transistor TFT can apply voltage to the liquid crystal layer 230 for driving liquid crystals to tilt in order to display images.

Different from the prior art, a recess area 228 of the insulating layer 222 is formed below the sub spacer PS2, such that a distance d1 from the upper surface of the insulating layer 222 near the main spacer PS1 to the second substrate 220 is greater than a distance d2 from the upper surface of the insulating layer 222 near the sub spacer PS2 to the second substrate 220. In addition, a distance d3 from a bottom of the through hole 224 to the second substrate 220 is smaller than the distance d2 from the upper surface of the insulating layer 222 near the sub spacer PS2 to the second substrate 220. The recess area 228 and the through hole 224 of the insulating layer 222 can be formed by performing a halftone mask process to etch different areas of the insulating layer 222 in different depths.

According to the above arrangement, under a situation that the lengths of the main spacer PS1 and the sub spacer PS2 are identical, the sub spacer PS2 and the transparent conductive layer 226 are still separated by a gap, in order to increase an aperture ratio of the liquid crystal display panel. Therefore, a color filter substrate consisted of the first substrate 210 and the color filter layer 212 does not require the halftone mask to form the main and sub spacers with different lengths. Since the same arrangement of the insulating layer 222 is applicable to different liquid crystal display panels, the present invention only needs a same halftone mask to produce different liquid crystal display panels with high aperture ratio (HAR), and further reduces product development complexity of the liquid crystal display panel with high aperture ratio.

The above pixel structure is applicable to a liquid crystal display panel with high aperture ratio made by a one drop fill process, that is, the liquid crystal layer 230 is formed between the first substrate 210 and the second substrate 220 by the one drop fill process.

In addition, the transparent conductive layer 226 is formed across the thin film transistor TFT, and the transparent conductive layer 226 can be also formed across the scan line G and/or the data line D.

Figure 4:
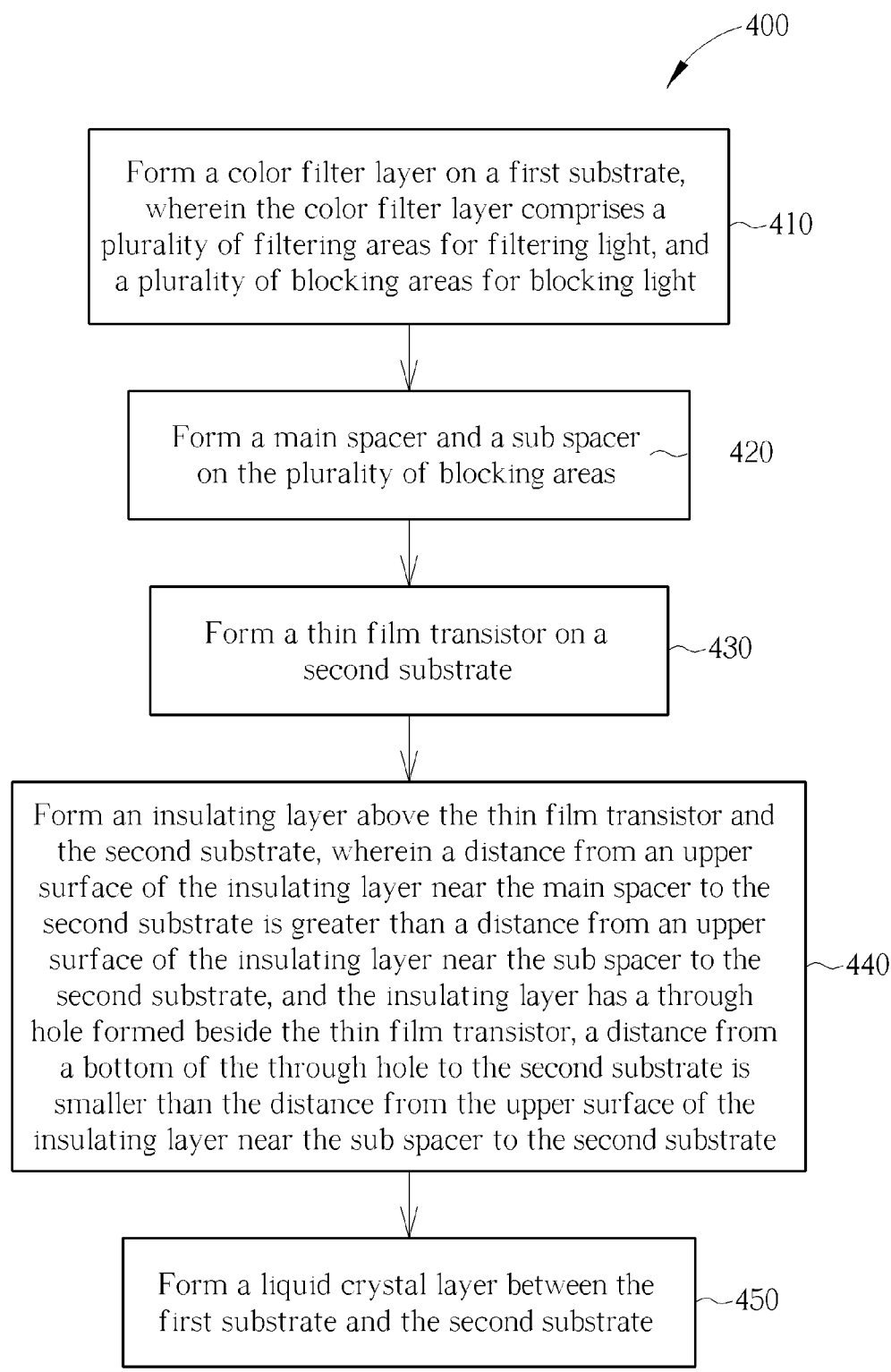
FIG. 4 is a flowchart showing a method for forming a pixel of a liquid crystal display panel of the present invention.

Please refer to FIG. 4. FIG. 4 is a flowchart 400 showing a method for forming a pixel of a liquid crystal display panel of the present invention. The flowchart of the method for forming the pixel of the liquid crystal display panel of the present invention comprises the following steps:

Step 410: Form a color filter layer on a first substrate, wherein the color filter layer comprises a plurality of filtering areas for filtering light, and a plurality of blocking areas for blocking light;

Step 420: Form a main spacer and a sub spacer on the plurality of blocking areas;

Step 430: Form a thin film transistor on a second substrate;

Step 440: Form an insulating layer above the thin film transistor and the second substrate, wherein a distance from an upper surface of the insulating layer near the main spacer to the second substrate is greater than a distance from an upper surface of the insulating layer near the sub spacer to the second substrate, and the insulating layer has a through hole formed beside the thin film transistor, a distance from a bottom of the through hole to the second substrate is smaller than the distance from the upper surface of the insulating layer near the sub spacer to the second substrate; and Step 450: Form a liquid crystal layer between the first substrate and the second substrate.

In contrast to the prior art, the pixel structure of the liquid crystal display panel and the pixel forming method of the present invention utilizes the halftone mask process to etch the insulating layer for forming the recess area and the through hole with different depths, and the recess area is under the sub spacer, such that the color filter substrate does not require the halftone mask to form the main spacer and the sub spacer with different lengths. Since the same arrangement of the insulating layer is applicable to different liquid crystal display panels, the present invention only needs the same halftone mask to produce different liquid crystal display panels with high aperture ratio (HAR), and further reduces product development complexity of the liquid crystal display panel with high aperture ratio.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of a liquid crystal display panel, comprising:
   a first substrate;
   a color filter layer, formed on the first substrate, the color filter layer comprising:
      a plurality of filtering areas, for filtering light; and
      a plurality of blocking areas, for blocking light;
   a main spacer, formed on one of the plurality of blocking areas;
   a sub spacer, formed on another one of the plurality of blocking areas;
   a second substrate;
   a thin film transistor, formed on the second substrate;
   an insulating layer, formed above the thin film transistor and the second substrate, wherein the insulating layer has a main area and a recess area, the recess area is a depression on the insulating layer where the sub spacer is formed and the main area has an area greater than an area of the recess area;
   a liquid crystal layer, formed between the first substrate and the second substrate;
   wherein a distance from the main area of the insulating layer to the first substrate is less than a distance from the recess area of the insulating layer to the first substrate.

2. The pixel structure of claim 1, wherein the thin film transistor is arranged below the main spacer.

3. The pixel structure of claim 1, wherein the insulating layer has a through hole formed beside the thin film transistor, a distance from a bottom of the through hole to the second substrate is smaller than the distance from the upper surface of the insulating layer near the sub spacer to the second substrate.

4. The pixel structure of claim 1 further comprising a transparent conductive layer formed on the insulating layer.

5. The pixel structure of claim 4, wherein the transparent conductive layer is formed across the thin film transistor.

6. The pixel structure of claim 4 further comprising a scan line and a data line electrically connected to the thin film transistor, wherein the transparent conductive layer is formed across the scan line and/or data line.

7. The pixel structure of claim 1, wherein lengths of the main spacer and the sub spacer are identical.

8. A method for forming a pixel of a liquid crystal display panel, comprising:
- forming a color filter layer on a first substrate, the color filter layer comprising a plurality of filtering areas for filtering light, and a plurality of blocking areas for blocking light;
- forming a main spacer and a sub spacer on the plurality of blocking areas;
- forming a thin film transistor on a second substrate;
- forming an insulating layer above the thin film transistor and the second substrate;
- forming a recess area on the insulating layer and a through hole on the insulating layer beside the thin film transistor, wherein the recess area is a depression on the insulating layer where the sub spacer is formed, a distance from a main area of the insulating layer to the first substrate is less than a distance from the recess area to the first substrate, the main area has an area greater than the recess area, and a distance from an upper surface of the through hole to the second substrate is less than the distance from an upper surface of the recess area to the second substrate; and
- forming a liquid crystal layer between the first substrate and the second substrate.

9. The method of claim 8, wherein the thin film transistor is formed below the main spacer.

10. The method of claim 8, wherein the liquid crystal layer is formed between the first substrate and the second substrate by a one drop fill process.

11. The method of claim 8, wherein the recess area and the through hole are formed by a halftone mask process.

12. The method of claim 8, wherein lengths of the main spacer and the sub spacer are identical.

13. The method of claim 8 further comprising forming a transparent conductive layer on the insulating layer.

* * * * *